United States Patent [19]
Woodward

[11] Patent Number: 5,892,220
[45] Date of Patent: Apr. 6, 1999

[54] LINEARIZED FEEDBACK ELEMENT FOR TWO-BEAM SMART PIXEL RECEIVERS

[75] Inventor: Ted Kirk Woodward, Monmouth, N.J.

[73] Assignee: Lucent Technologies Inc., Murray Hill, N.J.

[21] Appl. No.: 906,366

[22] Filed: Aug. 5, 1997

[51] Int. Cl.[6] ................................................ H01J 40/14
[52] U.S. Cl. .............................. 250/214 R; 250/214 LA
[58] Field of Search ...................... 250/214 R, 214 LA, 250/214 A; 327/54, 316, 323, 324; 330/59, 98–100

[56] References Cited

U.S. PATENT DOCUMENTS

| 5,280,201 | 1/1994 | Fujimori et al. | 307/448 |
| 5,389,776 | 2/1995 | Woodward | 250/214 LS |
| 5,581,077 | 12/1996 | Chirovsky et al. | 250/214 R |

OTHER PUBLICATIONS

Gareth F. Williams, "Lightwave Receivers", NYNEX Science and Technology, pp. 79–149 (Jan. 1989).
Joseph W. Goodman, et al. "Optical Interconnections for VLSI Systems", Proceedings of the IEEE, vol. 72, No. 7, pp. 159–175, (Jul. 1984).

Frederick B. McCormick, et al., "Five–stage free–space optical switching network with field–effect transistor self–electro–optic–effect–device smart–pixel arrays", Applied Optices, vol. 33, No. 8, pp. 1601–1618, (Mar. 10, 1994).
T.K. Woodward, et al., "1–Gb/s Two–Beam Transimpedance Smart–Pixel Optical Receivers Made from Hybrid GaAs. MQW Modulators Bonded to 0.8–βm Silicon CMOS", IEEE Photonics Technology Letters, vol. 8, No. 3, pp. 422–424 (Mar., 1996).
Ted. K. Woodward, "Optical Receivers for Optoelectronic VLSI", IEEE Journal of Selected Topics in Quantum Electronics, vol. 2, No. 1, pp. 106–116, (Apr. 1996).
Ashok V. Krishnamoorthy, et al., "Scaling Optoelectronic–VLSI Circuits into the 21st Century: A Technology Roadmap", IEEE Journal of Selected Topics in Quantum Electronics, vol. 2, No. 1, pp. 55–76, (Apr. 1996).

*Primary Examiner*—Que T. Le
*Attorney, Agent, or Firm*—Darby & Darby

[57] ABSTRACT

A feedback element for a two beam smart pixel receiver having at least one pair of electron devices of opposite electrical conductivity type, such as an NFET and a PFET, with input electrodes electrically connected and output electrodes electrically connected. The devices of a pair have opposing differential resistance characteristics in response to the same input signal so that the resistances of the devices of the pair add to become more linear.

12 Claims, 4 Drawing Sheets

LINEARIZED FEEDBACK ELEMENT FOR TWO-BEAM SMART PIXEL RECEIVERS

BACKGROUND OF THE INVENTION

"Smart Pixel" is a term applied to a device that includes one or more input optical receivers, one or more output optical modulators (or lasers), and electronic logic circuitry. Smart pixels are used in the field of optical interconnection within and between digital computing systems, such as switching systems and parallel processors. In one implementation of this concept, large numbers of optical receivers and transmitters are directly integrated with semiconductor electronic processing elements directly on the semiconductor chips that form the transmitter and/or receiver circuits. This has a number of potential advantages for switching and computing systems as detailed in the literature. See J. W. Goodman, F. I. Leonberger, Sun-Yuan Athale, R. A. Kung, *Proceedings of the IEEE*, 72,850 (Jul. 1984), and F. B. McCormick, et al, *Applied Optics*, 33, pp. 1601–1618, 1994.

The local nature of a smart pixel system may permit it to employ a receiver that operates more than one beam. A two-beam receiver provides advantages, such as increased noise immunity, because of the use of relative referencing, that is, using a signal corresponding to the difference between the signals from the two beams as the one to be processed. Optical receivers designed to operate with more than one optical beam are described in U.S. Pat. No. 5,389,776 to Woodward, granted Feb. 14, 1995 and U.S. Pat. No. 5,581,077 to Chirovsky, Novotny and Woodward, granted Dec. 3, 1996, both of which are assigned to the assignee of this application.

A common optical receiver design uses a trans-impedance amplifier. The feedback element of the trans-impedance amplifier stage is critical to the operation of the receiver. Use of a micro-FET (field effect transistor device) has been proposed as a feedback element in a trans-impedance amplifier, for example, as described in Gareth F. Williams, "Lightwave Receivers", in Topics in Lightwave Systems, ed. Tingye Li. (Academic Press, 1991), pp. 79–149. ISBN 0-12-447302-4. The micro-FET has the advantage of permitting a high-value resistance to be obtained without the penalty of high parasitic capacitance, as would occur with a conventional resistor. A trans-impedance amplifier using a single PFET device, or a PFET in combination with a diode-connected NFET, also has been used as a feedback element as described in Woodward, et al., *IEEE Photo. Tec. Lett.*, Vol. 8, pp. 422–424, Mar. 1996.

A difficulty arises, however, when using a single FET as the resistance feedback element in an amplifier stage of a two-beam optical receiver. With an amplifier that has a quiescent output voltage state Ve in a two-beam receiver, the amplifier output signal swings both positively and negatively with respect to Ve. This is in contrast to a single beam receiver in which the output swings in only one polarity with respect to Ve. Since the resistance of a single FET used as the feedback element is not symmetric with respect to positive and negative signal swings, the amplifier will experience different closed loop gain for positive and negative excursions of the output signal about Ve, depending on whether the feedback element is an N or P type FET. It will be appreciated that such an asymmetric response is undesirable in a two-beam receiver configuration.

The asymmetric response is shown referring to FIG. 1 and FIGS. 2A and 2B. FIG. 1 shows a basic representation of a FET device with typical operating voltages Vg (gate), Vd (drain), Vs (source) and Vb (body terminal). FIG. 1 illustratively represents either an N conductivity type FET (NFET) or a P conductivity type FET (PFET). FIGS. 2A and 2B illustratively shows NFET and PFET current-voltage (I-V) characteristics and differential resistance for the case where there is a fixed gate bias Vg and a fixed body terminal bias Vb.

Since an amplifier of a typical optical receiver may have an output voltage that varies either above or below a quiescent bias point (Ve), and a feedback element is connected between the amplifier output and input, of interest is the current voltage (I-V) behavior of an FET in which one of the source and drain is held at a relatively fixed voltage while the other terminal is varied through the power supply range. The gate voltage is also held fixed typically at either the corresponding positive or negative supply voltage, although dedicated bias levels are also possible.

Referring to FIG. 2A, for an NFET device of FIG. 1, consider that Vg=5.2V, Vb=0V and source voltage Vs is held fixed at 2.2V. The drain terminal voltage Vd is varied from 0 to 5V. As seen in FIG. 2A, in one bias direction of Vd at about 3V, the NFET device enters saturation, that is, the 3V curve (solid line) flattens out, while in the other bias direction it does not. Thus, the differential resistance curve is not uniform, as shown by the dotted line, for values positive and negative from Vd=2.5V over the range 0 to 5 volts.

In FIG. 2B, for a PFET device, consider that Vg=0.2V and Vb=5V. As seen, the I-V curve flattens at a Vd of below about 2V and the differential resistance is not equal above and below Vd=2.5 as shown by the dotted line. The curves of FIGS. 2A and 2B are for FETs having a gate length of 0.8 μm and a gate width of 1 μm, but the basic device behavior is independent of these choices.

Since the resistance of the amplifier feedback element affects the smart pixel receiver overall operation, and the resistance of a single FET used as a feedback element is not symmetrical, for operation of a two beam optical receiver it is advantageous to provide a feedback element that has a more linear and symmetrical differential resistance characteristic.

BRIEF DESCRIPTION OF THE INVENTION

The present invention is directed to providing a feedback element for a trans-impedance amplifier of a two-beam optical receiver that has an improved linearity feedback resistance characteristic. In accordance with the invention, an optical receiver includes an amplifier having a feedback element formed by a pair of FETs of opposite conductivity types connected in parallel. The amplifier receives an input signal from two optical beams. One beam produces positive voltage swings from the amplifier quiescent level and the other produces negative swings. The input signal moving in one or the other polarity directions tends to drive one or the other of the FETs of the feedback element FET pair into saturation, a high differential resistance state for the saturated FET, while the opposite conductivity type FET operates in the linear region of its I-V curve, with a lower value of resistance. Since the FETs of the pair are connected in parallel, the total resistance of the pair will be substantially the same as the lower resistance value. If the two FETs of the feedback element pair are matched, the resistance of the pair will have substantially the same value for output voltage swings above and below Ve. This produces a more linear feedback resistance in response to a positive and negative varying input signal from the two beams. Alternatively, a series connection can be made so that one device is always being driven into saturation, to obtain a symmetric high value of resistance.

BRIEF DESCRIPTION OF THE DRAWINGS

The foregoing and other features of the present invention will become more apparent upon reference to the following detailed description of an exemplary embodiment of the invention taken in conjunction with the annexed drawings in which.

DETAILED DESCRIPTION OF AN EXEMPLARY EMBODIMENT OF THE INVENTION

Figure 1:
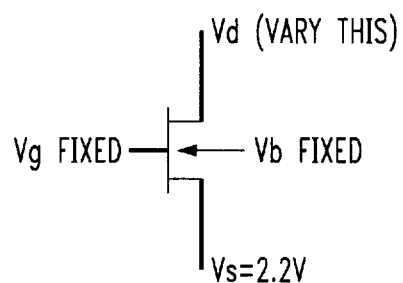
FIG. 1 is a schematic diagram of an FET device.
Figure 2A:
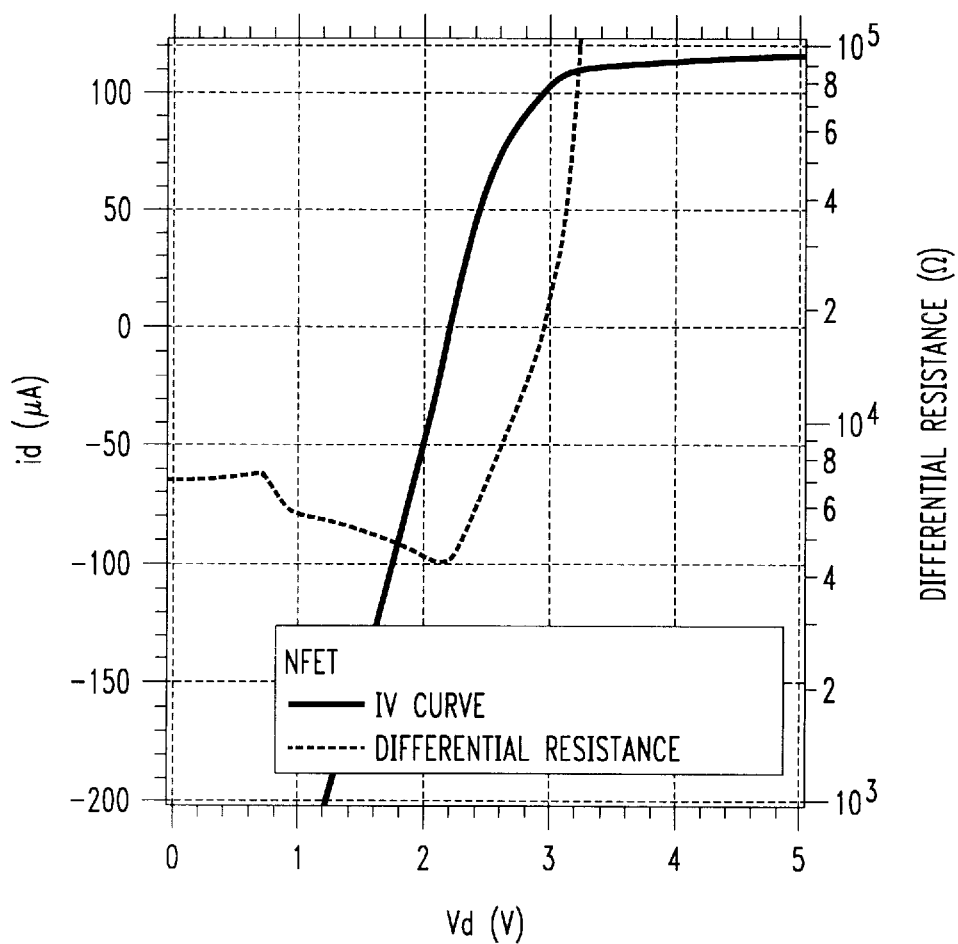
FIGS. 2A and 2B are representations of the I-V and differential resistance curves for an NFET and a PFET device.
Figure 2B:
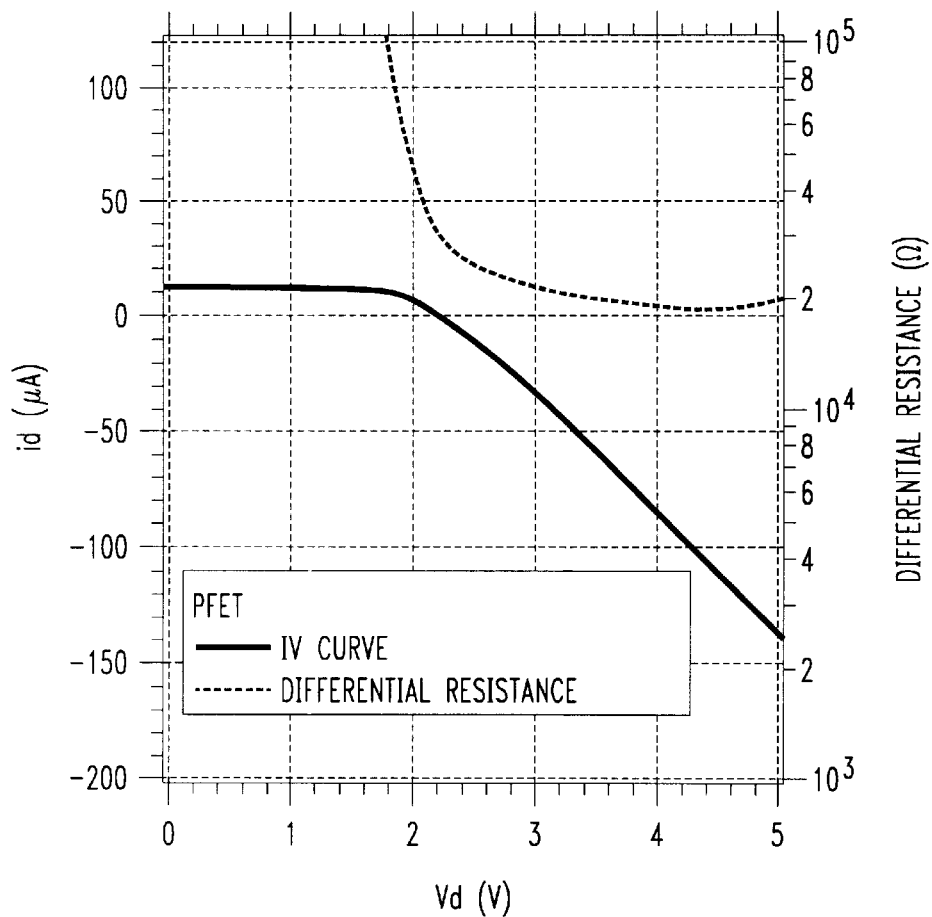
Figure 3:
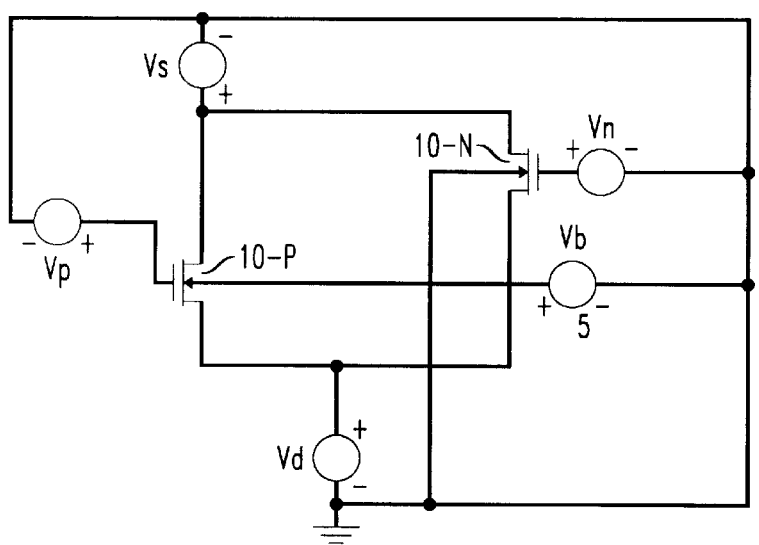
FIG. 3 is a schematic diagram illustrating the operation of a circuit formed by a parallel combination of an NFET and PFET.

FIG. 3 shows a representative circuit for use in simulation of the circuit behavior of a feedback element formed of a parallel combination of a PFET and an NFET. In FIG. 3, an NFET 10-N is connected in parallel with a PFET 10-P with the source of 10-N connected to the source of 10-P and the drain of 10-N connected to the drain of 10-P. The source of each of the FETs 10-N and 10-P has the same voltage Vs applied and the drain of each of 10-N and 10-P has the same voltage Vd applied. In the example, NFET 10-N has a length of $1\mu$ and a width of $1\mu$ while PFET 10-P has a length of $1\mu$ and a width of $3\mu$. The gate voltage to 10-N is Vn and that to 10-P is Vp. For the example shown Vs=2.2 V and Vp, the bias on the gate of the PFET 10-P, is typically 0 or 7V. Vn, the bias on the gate of the NFET 10-N, is typically −5 or −3V. The body terminal voltage Vb is held fixed at +5V.

Figure 4:
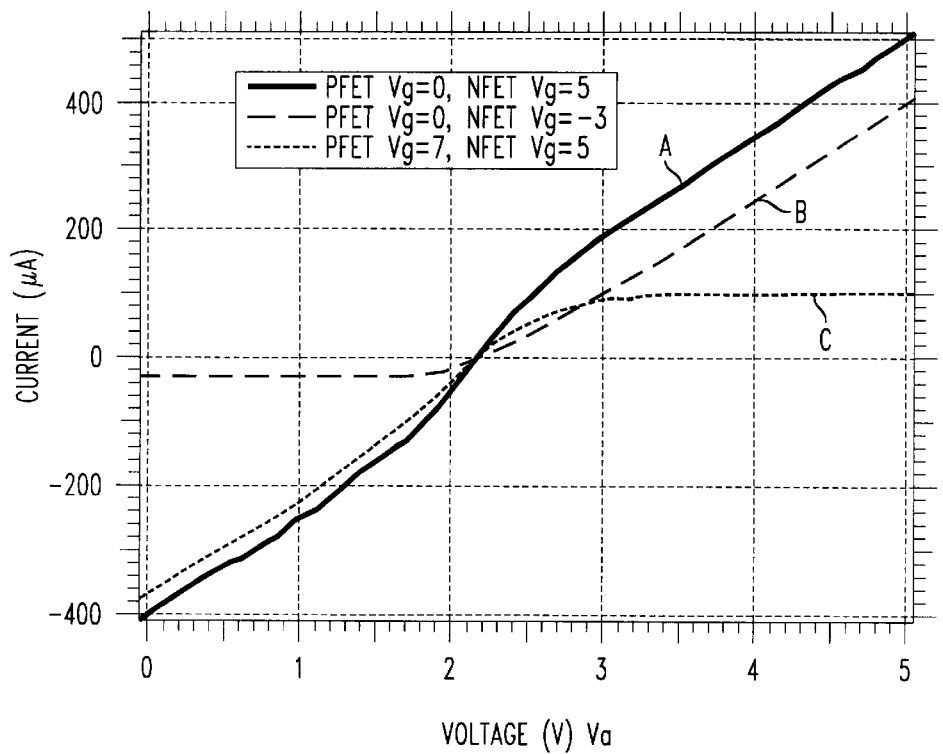
FIG. 4 is a graph showing the I-V characteristics of the circuit of FIG. 3.

In an example explaining the operation of the circuit of FIG. 3, consider that the current flowing from the Vd supply is monitored while the source voltage Vs is held fixed at 2.2V (a typical value for an inverter based amplifier using a 5V supply). FIG. 4, which shows the monitored drain current, is directed to the case in which one or the other FET 10-N or 10-P is cut-off (Vg<threshold voltage Vth of the device). The current-voltage behavior of one FET is traced, assuming the subthreshold current of the other FET is negligible. The drain voltage Vd is varied between 0 and 5V, while the gate of the NFET 10-N and the PFET 10-P are held at various bias levels.

In FIG. 4, line A, the heavy solid line, shows variation of the drain current with Vg=0 for PFET 10-P and Vg=+5V for NFET 10-N as Vd is varied from 0V through +5V. Neither FET is turned off under these conditions. Line B, the longer dashed line, shows drain current variation as Vd is varied with NFET 10-N being turned off when Vg=0 for PFET 10-P and Vg=−3V for NFET 10-N. As seen, the PFET 10-P enters saturation at lower values of Vd. Line C, the shorter dashed line, shows drain current variation as Vd is varied with the PFET 10-P turned off when Vg=+7V for PFET 10-P and Vg=+5V for NFET 10-N. Here, the NFET 10-N enters saturation at higher values of Vd. As is seen in FIG. 4, with the Vg values indicated, Vs=2.2V, and Vd swept from 0 to 5V, the FET enters saturation for excursions of Vd significantly above or below the Vd=2.2V point. Saturation of an FET results in a very high value of the differential resistance for the FET.

Figure 5:
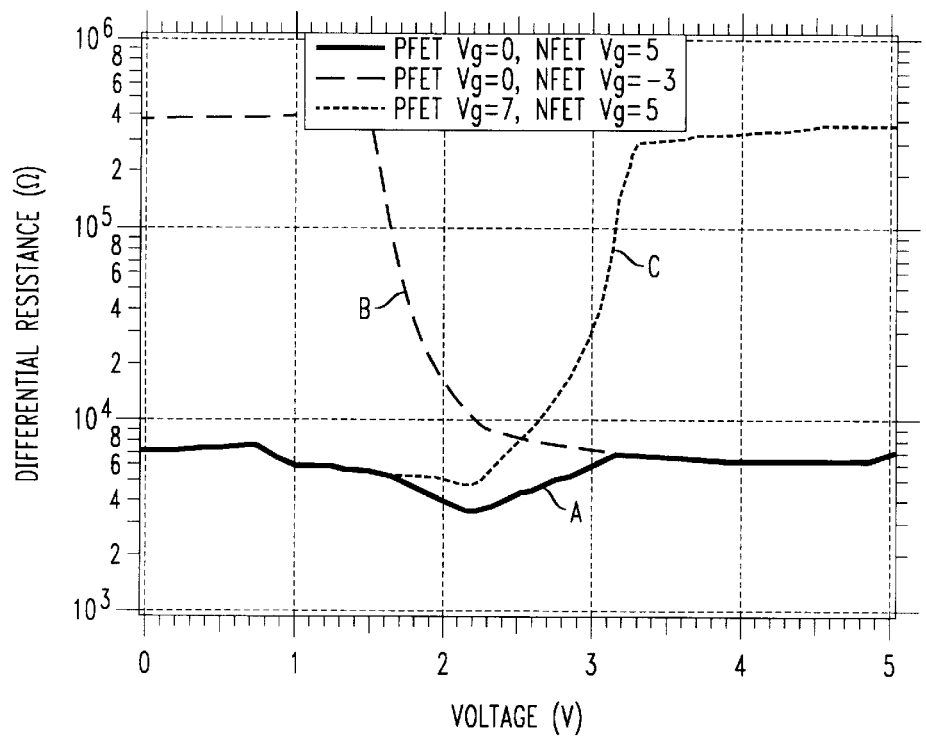
FIG. 5 is a graph showing the differential resistance of the circuit of FIG. 3.

The differential resistance of the parallel PFET-NFET circuit of FIG. 3 is shown in FIG. 5 with lines A, B and C corresponding to the same operating conditions as discussed with respect to FIG. 4. Note that an NFET or a PFET alone has a strong variation of differential resistance with varying voltage Vd (almost 2 orders of magnitude), while the variation of the PFET-NFET parallel pair as shown by line A is much less (about a factor of 2). When both FETs are biased with Vg>Vth, the circuit of the NFET-PFET pair does not exhibit the saturation, and the slope of the I-V curve is much more linear than for one or the other FET by itself. This is reflected in a much smaller variation of the differential resistance with varying Vd.

Figure 6:
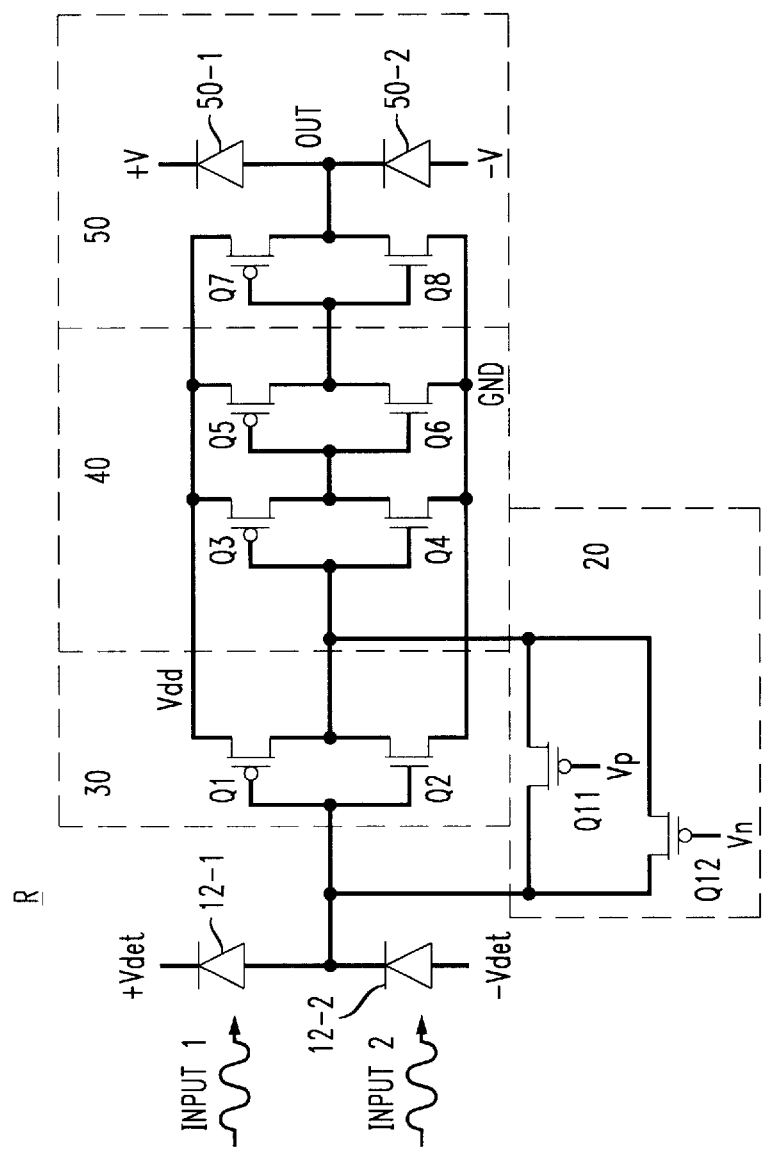
FIG. 6 is a schematic diagram of an optical receiver for a two beam smart pixel system with a trans-impedance amplifier having a feedback element in accordance with a specific illustrative embodiment of the invention.

FIG. 6 is a circuit of an optical receiver R. The receiver, without the feedback element, is described in more detail in Woodward, et al. IEEE Phot. Tech. Lett. v. 8, pp. 422–424, Mar. 1996. The receiver R has a pair of optical detectors 12-1, 12-2 supplying the input signals, a pre-amplifier 30 with a feedback element 20 according to the invention, a post-amplifier 40, and a decision circuit 50 designed to amplify signals to logic levels sufficient for further digital processing.

In FIG. 6, the anode of photodetector 12-1 is connected to the cathode of photodetector 12-2. The cathode of detector 12-1 is biased at +Vdet while the anode of detector 12-2 is biased at −Vdet. Each of the photodetectors receives an optical input signal as shown and produces a combined differential output signal. The pre-amplifier 30 has two FETs Q1 (PFET) and Q2 (NFET) whose gates are connected and receive the combined input signal from the photodetectors 12-1 and 12-2. The drain of Q1 receives the operating voltage Vdd while the source of Q2 is at ground potential. The source of Q1 is connected to the drain of Q2 to provide an output from pre-amplifier 30 which is applied to the post-amplifier 40.

Post-amplifier 40 is formed by two PFET-NFET pairs Q3-Q4 and Q5-Q6. The inverter formed by the FETs Q3-Q4 provides post-amplifier gain. FETs Q5-Q6 form an input/output shorted inverter that reduces and stabilizes the gain of the Q3-Q4 inverter. The combination of Q3-Q4 and Q5-Q6 has a reduced, broadened and stabilized gain determined primarily by the width/length ratios of the constituent elements as described at pages 422–424 of the foregoing Woodward, et al publication. FIG. 6 shows two pairs of FETs connected in series to form the post-amplifier 40 but as many such pairs can be used as needed to achieve the desired amplification factor for the receiver.

The output of the post amplifier 40 is applied to the connected gates of the inverter defined by Q7-Q8 which forms the decision circuit 50. Circuit 50 operates to amplify the signals to a level suitable for further digital processing. Several such amplifier stages 50 can be connected in series as needed.

The feedback element 20 is formed by the PFET Q11 and NFET Q12 connected in parallel, drain to drain and source to source. The common source connection of the feedback element 20 is connected to the output of the pre-amplifier 30 and the common drain connection is connected to the common gate connection Q1-Q2.

The two detectors 12-1 and 12-2 convert optical signals incident upon them into photo current. Light incident on detector 12-1 generates a current I1 and tends to drive the input applied to the pre-amplifier 30 toward +Vdet. This causes the pre-amplifier 30 output voltage to swing from Vdd toward the negative supply bias, in this case ground potential. Conversely, light incident on photodetector 12-2 generates a current I2 that tends to drive the pre-amplifier 30 input towards −Vdet, and the output of the pre-amplifier toward Vdd, the positive supply bias. If the feedback element 20 of the pre-amplifier presents a constant impedance to the incident light, then a current I1 in photodetector 12-1 will give rise to the same absolute voltage difference |V1-Ve| as a current I2 in photodetector 12-2 gives rise to an absolute voltage difference |V2-Ve|, where Ve is the quiescent output voltage of the pre-amplifier 30.

The gate voltages for the PFET pair of the feedback element can be either fixed or variable. In the exemplary circuit, the gate voltage Vp of PFET Q11 can be set at 0V and the gate voltage Vn for NFET Q12 can be connected to the drain voltage supply Vdd. This corresponds roughly to line A of FIGS. 4 and 5. Also, one FET of the pair can be supplied with a gate voltage such as to keep the FET saturated and thereby provide a high resistance. Techniques for providing variable gate voltages are discussed in the aforesaid Williams text. Whether the gate voltages are fixed or variable, one device Q11 or Q12 of the feedback element is always being driven into saturation. Thus, the impedance of the feedback element 20 is maintained relatively constant, as shown by line A of FIG. 5, and the gain of pre-amplifier 30 is also relatively constant.

If the impedance of the feedback element 20 varies significantly with the output voltage of the pre-amplifier, the overall response of the receiver will be different for the case of light incident on photodetector 12-1 as compared to the case of light incident on photodetector 12-2. This means that the pre-amplifier output signal swing about Ve will be unbalanced even in the presence of equal power level signals for stimulation of photodetectors 12-1 and 12-2. For example, consider that light is first incident on photodetector 12-1, generating a current I1 there. This causes a voltage V1 to appear at the pre-amplifier output. If the receiver photodetectors are permitted to remain in darkness, the pre-amplifier output will return to Ve. If light is then supplied to photodetector 12-2, current I2 will cause the pre-amplifier output to change to voltage V2, and |V1-Ve| will be different from |Ve-V2| resulting in an undesired asymmetric signal swing of the pre-amplifier output about Ve.

There are a variety of circumstances under which such an asymmetric response would be undesirable. For example, variation in the small signal bandwidth of the circuit, which can result from a variation in the feedback impedance, is generally undesirable. Asymmetric response is also undesirable in a smart pixel receiver which is typically fully integrated on a semiconductor chip and must amplify input signals to logic levels suitable for further digital processing in a relatively small number of stages while consuming minimal electrical and optical power, and be dc-coupled.

The circuit of the invention aids in obtaining optimum performance of a two-beam smart pixel receiver by making the response of the total receiver symmetric with respect to input signals which are generally symmetric signals in a differentially-coded system. That is, the photocurrent difference between 12-1 and 12-2 is usually the same for a binary bit "1" as for a binary bit "0", merely differing in polarity. If the receiver first amplifier stage response is asymmetric, then the design of subsequent amplification and decision stages is more complicated. However, with a symmetric response for the first amplifier stage as is provided by the feedback element of the invention, the subsequent stages of the receiver may be designed to match the first stage, providing symmetric swings about the bias points of the stages, and yielding a balanced response to input signal swings of either polarity about the first stage amplifier output Ve.

It has been shown that it is advantageous to use FETs as feedback elements in photo receivers. However, it is important to note that prior art receivers are concerned with operation with a single input beam. In such prior art receivers, it is not necessary to consider a parallel combination of FETs to obtain a nearly linear feedback resistance, since the biasing of the circuit can be arranged such that the FET forming the feedback element is not driven into saturation. In such a case, the FET is operated in the linear region of its I-V characteristic, as shown in FIG. 4. Further, prior art (cf. Williams) teaches that it is undesirable to put excess capacitance inside the feedback loop, since this capacitance contributes directly to bandwidth limitation, without being reduced by the open-loop amplifier gain, in contrast to capacitance outside the feedback loop whose effect on bandwidth is reduced by the amplifier gain. Accordingly, it would conventionally be considered bad practice to compose a feedback element from a parallel combination of FETs, since this would increase the capacitance inside the feedback loop. In the case of a two-beam optical receiver in which symmetric response is desired, the benefits of linearizing the feedback resistance often outweigh the penalty of increased loop capacitance.

Specific features of the invention are shown in one or more of the drawings for convenience only, as each feature may be combined with other features in accordance with the invention. Alternative embodiments will be recognized by those skilled in the art and are intended to be included within the scope of the claims.

I claim:

1. A feedback element comprising
   a pair of first and second semiconductor devices connected in parallel each having a control electrode, an input electrode and an output electrode, said first and second semiconductor devices having differential resistance characteristics that are opposite in response to the same input signal applied to the control electrode of each of said devices.

2. A feedback element as in claim 1 in combination with an amplifier having an input and an output, said feedback element connected between the input and output of said amplifier.

3. A feedback element as in claim 1 wherein each of said first and second semiconductor devices has an input, an output and a control electrode, the change in current flow between the input and output of said devices being opposite in response to a signal applied to the control electrode of each of said devices.

4. A feedback element as in claim 1 wherein said first and second semiconductor devices comprise FETs of opposite conductivity type.

5. A feedback element as in claim 4 wherein one of said first and second devices is an NFET and the other is a PFET, the two FETs being electrically connected in parallel.

6. A feedback element as in claim 2 further comprising a photodetector supplying an input signal to said amplifier input.

7. A feedback element as in claim 6 wherein the change in current flow between the input and output of said devices being opposite in response to a signal applied to the control electrode of each of said devices.

8. A two beam optical receiver comprising:

an amplifier having an input and an output, a pair of photodetectors connected to provide a differential output signal as an input signal to said amplifier input, a feedback element connected between said amplifier input and output comprising first and second semiconductor devices connected in parallel, each of said semiconductor devices having a control electrode and an output, said first and second devices having differential resistance characteristics that are opposite in response to the same input signal applied to the control electrode of each of said devices.

9. A two beam optical receiver as in claim 8 wherein each of said first and second semiconductor devices has an input, an output and a control electrode, the change in current flow between the input and output of said devices being opposite in response to a signal applied to the control electrode of each of said devices.

10. A two beam optical receiver as in claim 9 wherein said first and second devices comprise transistors of opposite conductivity type.

11. A two beam optical receiver as in claim 10 wherein one of said first and second devices is an NFET and the other is a PFET, the two FETs being electrically connected in parallel.

12. A two beam optical receiver as in claim 9 wherein one of said semiconductor devices has a signal applied to its control electrode to hold said one semiconductor device in a saturated state.

* * * * *